(12) United States Patent
Yoon et al.

(10) Patent No.: US 8,519,612 B2
(45) Date of Patent: Aug. 27, 2013

(54) ORGANIC LIGHT EMITTING DIODE DISPLAY DEVICE AND METHOD OF FABRICATING THE SAME

(75) Inventors: Ju-Won Yoon, Yongin (KR); Su-Mi Lee, Yongin (KR); Sung-Ho Kim, Yongin (KR); Il-Jeong Lee, Yongin (KR); Ji-Yong Noh, Yongin (KR); Hee-Seong Jeong, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 337 days.

(21) Appl. No.: 12/873,519

(22) Filed: Sep. 1, 2010

(65) Prior Publication Data
US 2011/0127499 A1  Jun. 2, 2011

(30) Foreign Application Priority Data

Nov. 30, 2009 (KR) .................. 10-2009-0116422

(51) Int. Cl.
*H01J 1/62* (2006.01)
*H01J 63/04* (2006.01)
*H01J 9/00* (2006.01)
*B32B 9/00* (2006.01)

(52) U.S. Cl.
USPC ........... 313/503; 313/483; 313/500; 313/501; 313/502; 313/504; 313/505; 313/506; 445/24; 445/25; 445/1; 428/690; 428/917

(58) Field of Classification Search
None
See application file for complete search history.

(56) References Cited

U.S. PATENT DOCUMENTS

| 6,862,066 B2 * | 3/2005 | Oowaki et al. ................ 349/139 |
| 7,626,329 B2 * | 12/2009 | Ryu et al. ...................... 313/504 |
| 2005/0179368 A1 * | 8/2005 | Ryu et al. ...................... 313/504 |

FOREIGN PATENT DOCUMENTS

| KR | 20030019874 A | 3/2003 |
| KR | 20030079500 A | 10/2003 |
| KR | 10-2005-0017417 | 2/2005 |
| KR | 10-2005-0037913 | 4/2005 |
| KR | 10-2005-0076464 A | 7/2005 |
| KR | 10-2006-0001710 | 1/2006 |

* cited by examiner

*Primary Examiner* — Natalie Walford
(74) *Attorney, Agent, or Firm* — Robert E. Bushnell, Esq.

(57) ABSTRACT

An organic light emitting diode (OLED) display device and a method of fabricating the OLED display device, the OLED display device includes a substrate including an emission region and a non-emission region, a black matrix disposed in a region excluding a part of the emission region, a buffer layer disposed on the entire surface of the substrate, a semiconductor layer disposed on the buffer layer in the non-emission region, a gate electrode disposed on the semiconductor layer, a gate insulating layer insulating the semiconductor layer from the gate electrode and formed on the entire surface of the substrate, a first electrode formed on the gate insulating layer in the emission region, source and drain electrodes electrically connected with the semiconductor layer and the first electrode, an interlayer insulating layer insulating the source and drain electrodes from the gate electrode and opening a part of the first electrode, a pixel defining layer opening a part of the first electrode and disposed on the entire surface of the substrate, an organic layer disposed on the first electrode, and a second electrode disposed on the entire surface of the substrate. Here, the first electrode includes a transparent conductive oxide layer.

19 Claims, 5 Drawing Sheets

ORGANIC LIGHT EMITTING DIODE DISPLAY DEVICE AND METHOD OF FABRICATING THE SAME

CROSS-REFERENCE TO RELATED APPLICATION

This application claims the benefit of Korean Patent Application No. 10-2009-0116422, filed Nov. 30, 2009, in the Korean Intellectual Property Office, the disclosure of which is hereby incorporated herein by reference in its entirety.

BACKGROUND OF THE INVENTION

1. Field of the Invention

Aspects of the present invention relate to an organic light emitting diode (OLED) display device and a method of fabricating the same, and more particularly, to a method of forming a black matrix in a device using a compound semiconductor to improve internal optical efficiency and reduce reflection of external light.

2. Description of the Related Art

A conventional OLED display device having a planar structure loses contrast when an electroluminescent element emits light due to reflection of external light caused by metallic materials such as a gate electrode and source and drain electrodes of a thin film transistor, a capacitor electrode and an interconnection. Particularly, when a mobile display device is exposed to external light, a decrease in contrast due to high reflectance of the external light causes a serious problem.

To prevent such a decrease in contrast due to the reflection of the external light, an expensive polarizer is adhered to the entire surface of a conventional display device. However, this causes an increase in production cost, and since the polarizer blocks light emitted from an organic emission layer, transmittance is decreased and thus brightness is also decreased.

For these reasons, research to improve optical characteristics and increase efficiency of a device is needed.

SUMMARY OF THE INVENTION

Aspects of the present invention provide an OLED display device and a method of fabricating the same, and more particularly, a method of forming a black matrix in a device using a compound semiconductor to improve internal optical efficiency and reduce reflection of external light.

According to an aspect of the present invention, an OLED display device includes: a substrate including an emission region and a non-emission region; a black matrix disposed in a region excluding a part of the emission region; a buffer layer disposed on an entire surface of the substrate; a semiconductor layer disposed on the buffer layer in the non-emission region; a gate electrode disposed on the semiconductor layer; a gate insulating layer insulating the semiconductor layer from the gate electrode and formed on the entire surface of the substrate; a first electrode formed on the gate insulating layer in the emission region; source and drain electrodes electrically connected with the semiconductor layer and the first electrode; an interlayer insulating layer insulating the source and drain electrodes from the gate electrode and exposing a part of the first electrode; a pixel defining layer exposing a part of the first electrode and disposed on the entire surface of the substrate; an organic layer disposed on the first electrode; and a second electrode disposed on the entire surface of the substrate. Here, the first electrode includes a transparent conductive oxide layer.

According to another aspect of the present invention, a method of fabricating an OLED display device, includes: preparing a substrate including an emission region and a non-emission region; forming a black matrix on the substrate excluding a part of the emission region; forming a buffer layer on an entire surface of the substrate; forming a semiconductor layer on the buffer layer in the non-emission region; forming a gate insulating layer on the entire surface of the buffer layer; forming a first electrode in the emission region and a gate electrode in the non-emission region on the gate insulating layer; forming an interlayer insulating layer on the entire surface of the substrate; removing a part of the interlayer insulating layer, and forming a pixel defining layer exposing a part of the first electrode; forming an organic layer on the first electrode; and forming a second electrode on the entire surface of the substrate. Here, the substrate exposed through the black matrix is disposed under the first electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1A:
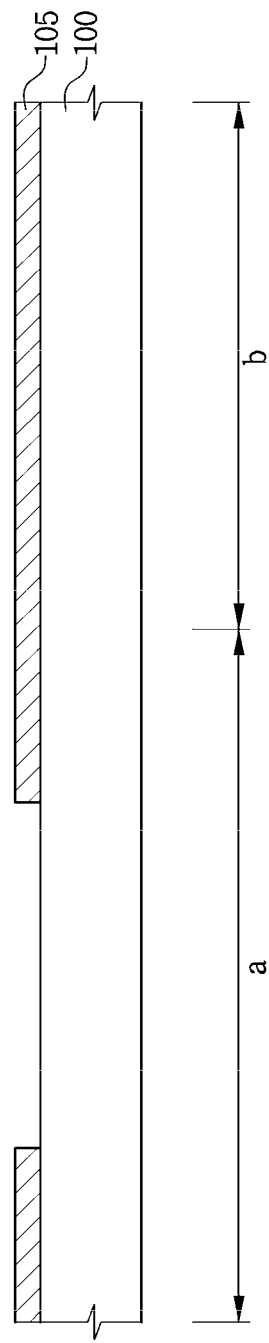
FIGS. 1A through 1F show an OLED display device according to an exemplary embodiment of the present invention.

Aspects of the present invention will now be described more fully hereinafter with reference to the accompanying drawings, in which exemplary embodiments of the invention are shown. Moreover, in the drawings, thicknesses of layers and regions are exaggerated for clarity. Here, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process. Further, some of the elements that are not essential to the complete understanding of the invention are omitted for clarity. Also, like reference numerals refer to like elements throughout.

Exemplary Embodiment

FIGS. 1A through 1F show a thin film transistor according to an exemplary embodiment of the present invention.

Referring to FIG. 1A, a substrate 100 including an emission region a and a non-emission region b is prepared, and a black matrix 105 is formed on the substrate 100. The black matrix 105 may include a combination layer of a transparent insulating layer and a metal, and the combination layer of the transparent insulating layer and the metal may be formed of a TCO such as ZnO, TiNx, TiOx, MoOx, AZO, GIZO, GZO, IZO or ICO. Alternatively, the combination layer may be formed in a multiple layer structure including a metal oxide or a metal nitride. The combination layer of the transparent insulating layer and the metal may be formed of triple or more-layered thin films, each thin film having a thickness of 10 to 200 μm. When the combination layer has such a thickness, light can be blocked and reflection of external light can be prevented.

Here, the black matrix 105 excludes a part of the emission region.

Figure 1B:
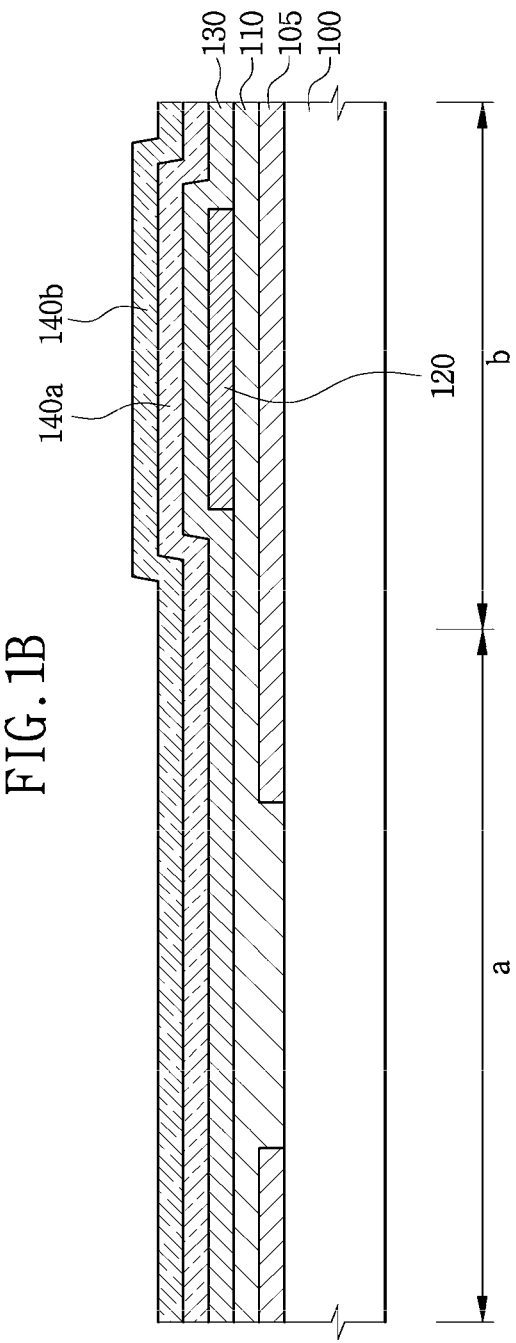

Referring to FIG. 1B, a buffer layer 110 is formed on the entire surface of the substrate 100. The substrate 100 may be formed of glass or plastic, and the buffer layer 110 may prevent out-diffusion of moisture or impurities generated from the substrate 100. The buffer layer 110 may be formed in a single or double layer structure using an insulating layer such as a silicon oxide layer or a silicon nitride layer.

Subsequently, a semiconductor layer 120 is formed on the buffer layer 110 to be disposed in the non-emission region b. The semiconductor layer is formed of a compound semiconductor, for example, one of oxide semiconductors including Zn, Ga, In, Al and Ag.

A gate insulating layer 130 is then formed on the entire surface of the substrate 100 including the semiconductor layer 120. The gate insulating layer 130 may be a silicon oxide layer, a silicon nitride layer, or a double layer thereof.

Afterwards, a first electrode metal layer for a first electrode 140a and a gate electrode metal layer for a gate electrode 140b are formed on the gate insulating layer 130. Here, the first electrode metal layer 140a may be a transparent conductive layer including one of ITO, IZO and ITZO. The gate electrode metal layer 140b may be formed in a single layer structure of aluminum (Al) or an Al alloy such as aluminum-neodymium (Al—Nd), or a multiple layer structure in which an Al alloy is stacked on a chromium (Cr) or molybdenum (Mo) alloy.

Figure 1C:
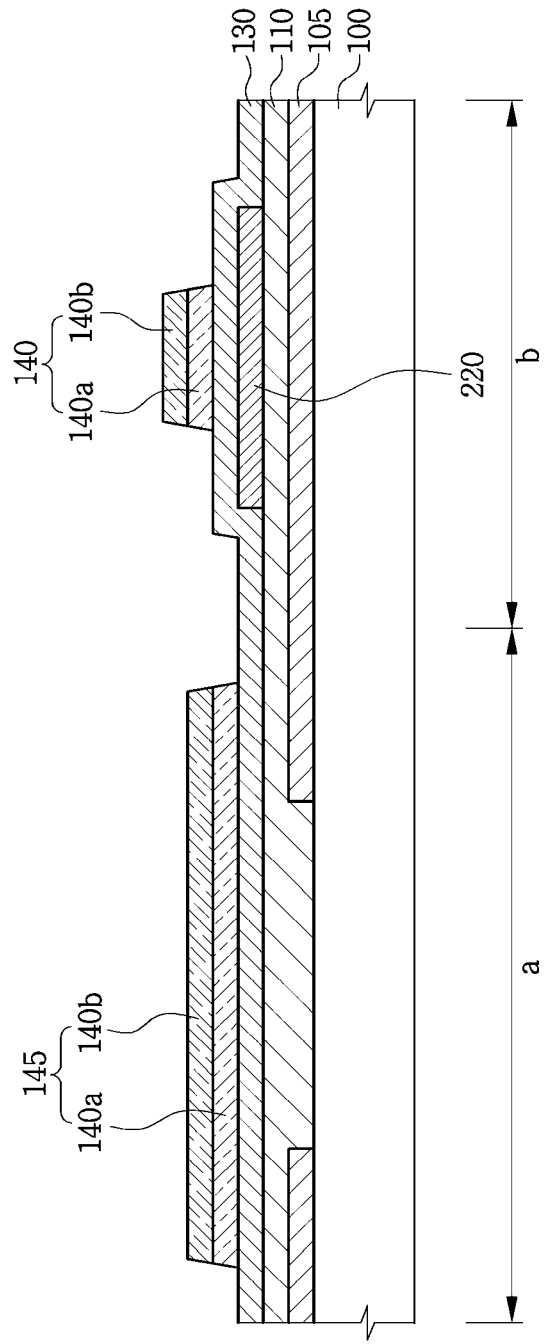

Referring to FIG. 1C, the first electrode metal layer 140a and the gate electrode metal layer 140b are patterned, thereby forming a first electrode 145 and a gate electrode 140, respectively. Here, the first electrode 145 is disposed in the emission region, and the gate electrode 140 is disposed in the non-emission region. There is a region in which the black matrix 105 is not present under the first electrode 145.

Figure 1D:
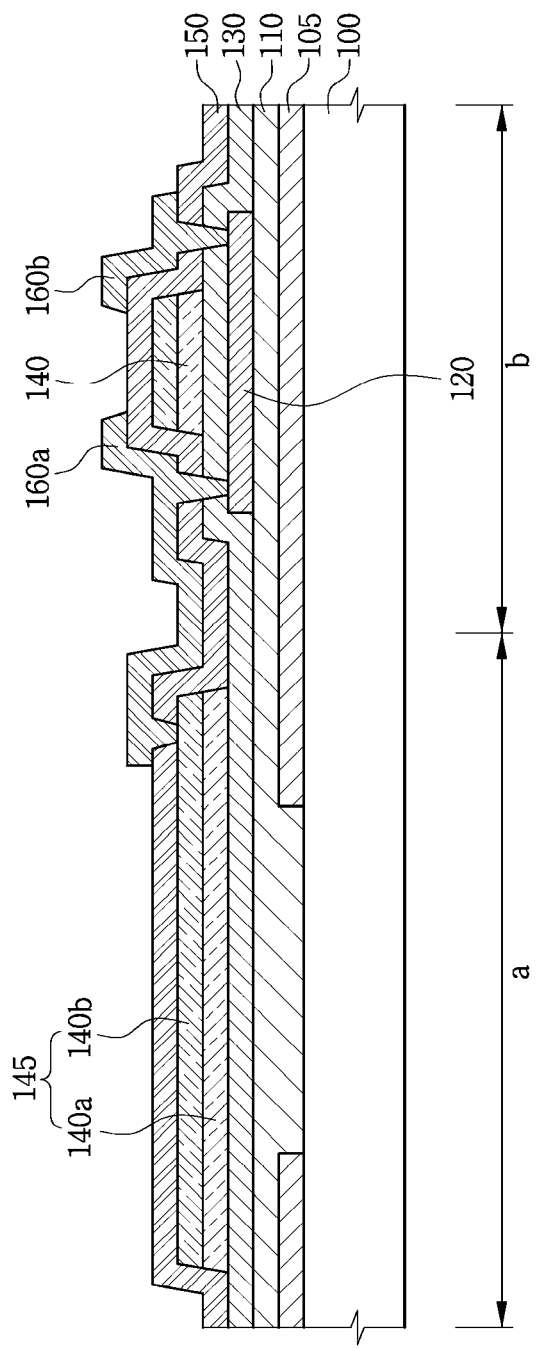

Referring to FIG. 1D, an interlayer insulating layer 150 is formed on the substrate. The interlayer insulating layer 150 has a contact hole (not shown) exposing a portion of the semiconductor layer 120 and a portion of the first electrode 145.

Source and drain electrodes 160a and 160b which are electrically connected with the semiconductor layer 120 and the first electrode 145 are formed on the substrate 100. The source and drain electrodes 160a and 160b may be formed of one selected from the group consisting of molybdenum (Mo), chromium (Cr), tungsten (W), MoW, aluminum (Al), Al—Nd, titanium (Ti), titanium nitride (TiN), copper (Cu), a Mo alloy, an Al alloy and a Cu alloy.

Figure 1E:
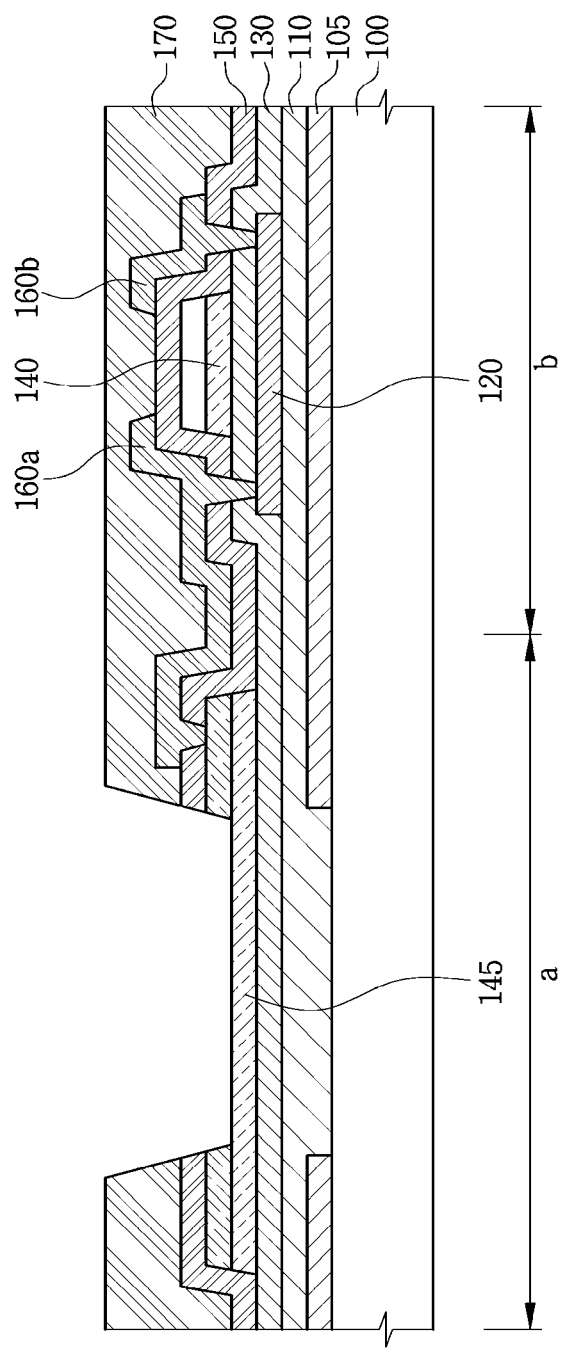

Referring to FIG. 1E, a pixel defining layer 170 exposing a portion of the first electrode 145 is formed on the substrate 100. Here, when the pixel defining layer 170 is formed, a part of the interlayer insulating layer 150 is removed, and a part of the gate electrode metal layer 140b, which is an upper layer of the first electrode 145, is etched to expose the first electrode metal layer 140a, which is a lower layer of the first electrode 145.

Figure 1F:
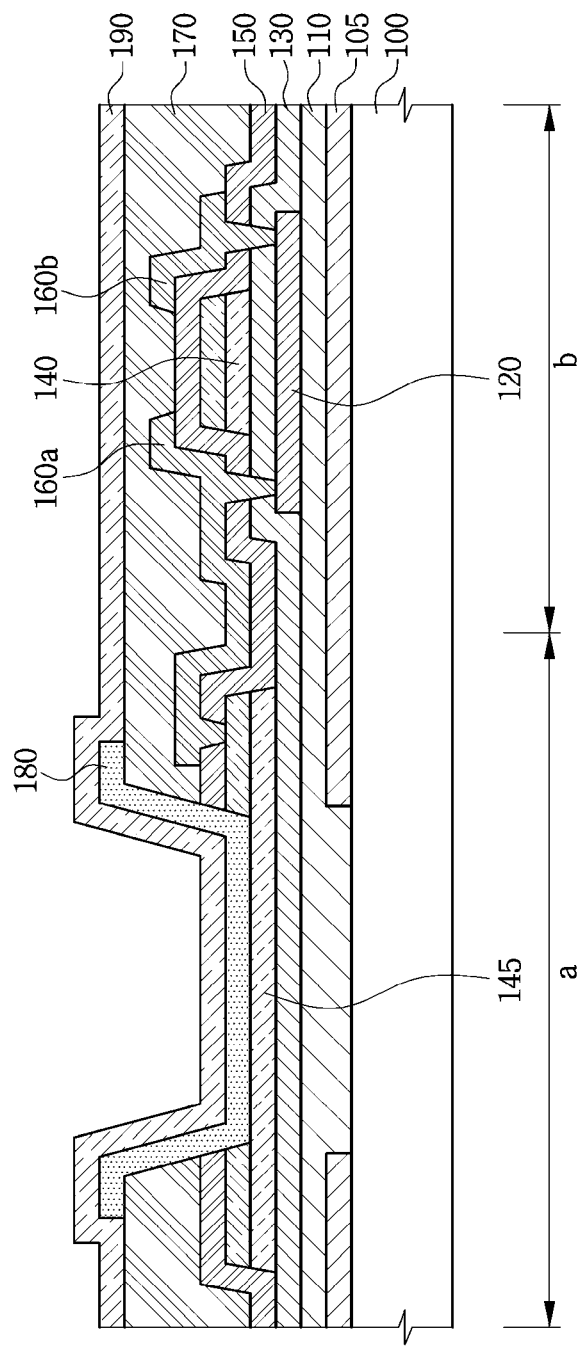

Referring to FIG. 1F, an organic layer 180 including an organic emission layer is formed on the exposed first electrode 145. Thus, the first electrode 145 formed of the first electrode metal layer 140a is disposed between the organic layer 180 and the buffer layer 110.

Afterwards, a second electrode 190 which is formed of a reflective layer including Mg, Ca, Al, Ag, Ba or an alloy thereof is formed on the entire surface of the substrate 100, and thus the OLED display device according to the exemplary embodiment of the present invention is completed.

An aspect of the present invention relates to an OLED display device including a compound semiconductor. While a device including a silicon semiconductor layer cannot have a black matrix under the device because the black matrix is damaged during high temperature annealing to crystallize the silicon layer, the present OLED display device includes a compound semiconductor layer, so that a black matrix, which is formed between a substrate and a buffer layer to reduce light reflection, is not damaged. Thus, the OLED display device can inhibit the light reflection, and prevent crossing of internal lights and thus increase internal optical efficiency.

According to an aspect of the present invention, since an OLED display device uses a compound semiconductor, and has a black matrix inside the device, the device can be slimmer, have improved internal optical efficiency, and prevent reflection of external light, thereby improving efficiency of the device.

Although the aspect of the present invention have been described with reference to predetermined exemplary embodiments thereof, it will be understood by those skilled in the art that a variety of modifications and variations may be made to the aspects of the present invention without departing from the spirit or scope of the present invention defined in the appended claims and their equivalents.

What is claimed is:

1. An organic light emitting diode (OLED) display device, comprising:
    a substrate including an emission region and a non-emission region;
    a black matrix disposed in a region excluding a part of the emission region;
    a buffer layer disposed on an entire surface of the substrate;
    a semiconductor layer disposed on the buffer layer in the non-emission region;
    a gate electrode disposed on the semiconductor layer;
    a gate insulating layer insulating the semiconductor layer from the gate electrode and formed on the entire surface of the substrate;
    a first electrode formed on the gate insulating layer in the emission region;
    source and drain electrodes electrically connected with the semiconductor layer and the first electrode;
    an interlayer insulating layer insulating the source and drain electrodes from the gate electrode and exposing a part of the first electrode;
    a pixel defining layer exposing a part of the first electrode and disposed on the entire surface of the substrate;
    an organic layer disposed on the first electrode; and
    a second electrode disposed on the entire surface of the substrate, wherein the first electrode includes a transparent conductive oxide layer.

2. The OLED display device according to claim 1, wherein the black matrix includes a combination layer of a transparent insulating layer and a metal.

3. The OLED display device according to claim 2, wherein the combination layer of the transparent insulating layer and the metal includes one of ZnO, TiNx, TiOx, MoOx, AZO, GIZO, GZO, IZO and ICO.

4. The OLED display device according to claim 1, wherein the semiconductor layer is an oxide semiconductor layer including one of Zn, Ga, In, Al and Ag.

5. The OLED display device according to claim 1, wherein the first electrode is formed of a first electrode metal layer.

6. The OLED display device according to claim 1, wherein the black matrix is formed of a multiple layer including a metal oxide or a metal nitride.

7. The OLED display device according to claim 1, wherein the first electrode includes a transparent conductive layer formed of one of ITO, IZO and ITZO.

8. The OLED display device according to claim 1, wherein the gate electrode is formed by stacking a first electrode metal layer and a gate electrode metal layer.

9. The OLED display device according to claim 8, wherein the first electrode metal layer is a transparent conductive layer formed of one of ITO, IZO and ITZO.

10. The OLED display device according to claim 8, wherein the gate electrode metal layer is formed in a single layer structure of aluminum (Al) or an Al alloy such as aluminum-neodymium (Al—Nd) or a multiple layer structure in which an Al alloy is stacked on a chromium (Cr) or molybdenum (Mo) alloy.

11. A method of fabricating an OLED display device, comprising:
 preparing a substrate including an emission region and a non-emission region;
 forming a black matrix on the substrate excluding a part of the emission region;
 forming a buffer layer on an entire surface of the substrate;
 forming a semiconductor layer on the buffer layer in the non-emission region;
 forming a gate insulating layer on an entire surface of the buffer layer;
 forming a first electrode in the emission region and a gate electrode in the non-emission region on the gate insulating layer;
 forming an interlayer insulating layer on the entire surface of the substrate;
 removing a part of the interlayer insulating layer, and forming a pixel defining layer exposing a part of the first electrode;
 forming an organic layer on the first electrode; and
 forming a second electrode on the entire surface of the substrate, wherein the substrate exposing through the black matrix is disposed under the first electrode.

12. The method according to claim 11, wherein the black matrix is formed of a multiple combination layer of a transparent insulating layer and a metal.

13. The method according to claim 12, wherein the multiple combination layer of the transparent insulating layer and the metal includes one of ZnO, TiNx, TiOx, MoOx, AZO, GIZO, GZO, IZO and ICO.

14. The method according to claim 11, wherein the semiconductor layer is formed of an oxide semiconductor layer including one of Zn, Ga, In, Al and Ag.

15. The method according to claim 11, wherein the gate electrode and the first electrode are simultaneously patterned.

16. The method according to claim 11, wherein the gate electrode and the first electrode are formed by stacking and patterning a first electrode metal layer and a gate electrode metal layer.

17. The method according to claim 16, wherein the first electrode metal layer is formed of a transparent conductive layer including one of ITO, IZO and ITZO.

18. The method according to claim 16, wherein the gate electrode metal layer is formed in a single layer structure of aluminum (Al) or an Al alloy such as aluminum-neodymium (Al—Nd), or a multiple layer structure in which an Al alloy is stacked on a chromium (Cr) or molybdenum (Mo) alloy.

19. The method according to claim 11, wherein the exposed part of the first electrode is formed of a single layer of the first electrode metal layer.

\* \* \* \* \*